United States Patent [19]
Kramer

[11] Patent Number: 5,903,144
[45] Date of Patent: May 11, 1999

[54] CIRCUIT CONFIGURATION FOR PHASE DIFFERENCE MEASUREMENT

[75] Inventor: Ronalf Kramer, München, Germany

[73] Assignee: Siemens Aktiengesellschaft, Munich, Germany

[21] Appl. No.: 08/603,930

[22] Filed: Feb. 20, 1996

[30] Foreign Application Priority Data

Feb. 17, 1995 [DE] Germany .......................... 195 06 007

[51] Int. Cl.⁶ .......................... G01R 25/08; H03K 19/02
[52] U.S. Cl. .................... 324/76.63; 324/76.55; 324/76.61; 324/76.77; 324/76.82; 326/16; 327/7; 327/12
[58] Field of Search .............................. 324/76.52, 76.55, 324/76.61, 76.62, 76.63, 76.77, 76.82; 326/16, 99; 327/3, 7, 12

[56] References Cited

U.S. PATENT DOCUMENTS

| | | | |
|---|---|---|---|
| 4,644,268 | 2/1987 | Malka et al. | 324/76.77 |
| 4,926,115 | 5/1990 | Tarleton et al. | 324/76.82 |

OTHER PUBLICATIONS

Electronic Circuits—Design and Applications Publ.1991 (Tietze et al.), pp. 869–870 (month unavailable).

*Primary Examiner*—Glenn W. Brown
*Attorney, Agent, or Firm*—Herbert L. Lerner; Laurence A. Greenberg

[57] ABSTRACT

A circuit configuration for measuring a phase difference between a reference signal and a clock signal includes a first shift register being clocked by the clock signal and having an input receiving the reference signal. A digital differentiator is connected downstream of the first shift register and has an output. A counter has an input receiving the clock signal and an output outputting a multidigit binary word. A buffer memory is connected to the counter and to the digital differentiator for storing the binary word at the output of the counter in memory upon an appearance of a corresponding output signal of the digital differentiator. The buffer memory has an output forming most significant bits of an output binary word. A second shift register is inversely clocked by the clock signal and has an input receiving the reference signal and an output. An analog differentiator has an input connected to the output of the digital differentiator and an output. A D flip-flop has a data input connected to the output of the second shift register and a clock input connected to the output of the analog differentiator for supplying an output signal forming a least significant bit of the output binary word.

1 Claim, 2 Drawing Sheets

CIRCUIT CONFIGURATION FOR PHASE DIFFERENCE MEASUREMENT

BACKGROUND OF THE INVENTION

Field of the Invention

The invention relates to a circuit configuration for measuring a phase difference between a reference signal and a clock signal.

Digital circuit configurations for phase difference measurement, which are also referred to as digital phase detectors, are known in many versions. One version is described, for instance, in the book entitled: Electronic Circuits—Design and Applications, by U. Tietze and C. Schenk, Berlin and Heidelberg 1991, pp. 869 f. Such circuit configurations generally compare a reference signal and a clock signal with one another and produce a binary word that corresponds to a phase difference between the two signals. The phase resolution is no higher than the period length of the higher-frequency signal of the two signals, which as a rule is the period length of the clock signal.

SUMMARY OF THE INVENTION

It is accordingly an object of the invention to provide a circuit configuration for phase difference measurement, which overcomes the hereinafore-mentioned disadvantages of the heretofore-known devices of this general type and which has a higher phase resolution.

With the foregoing and other objects in view there is provided, in accordance with the invention, a circuit configuration for measuring a phase difference between a reference signal and a clock signal, comprising a first shift register being clocked by a clock signal and having an input receiving a reference signal; a digital differentiator being connected downstream of the first shift register and having an output; a counter having an input receiving the clock signal and having an output outputting a multidigit binary word; a buffer memory being connected to the counter and to the digital differentiator for storing the binary word at the output of the counter in memory upon an appearance of a corresponding output signal of the digital differentiator, the buffer memory having an output at which a binary word is provided forming most significant bits of an output binary word; a second shift register being inversely clocked by the clock signal, having an input receiving the reference signal and having an output; an analog differentiator having an input connected to the output of the digital differentiator and having an output; and a D flip-flop having a data input connected to the output of the second shift register and a clock input connected to the output of the analog differentiator for supplying an output signal forming a least significant bit of the output binary word.

Other features which are considered as characteristic for the invention are set forth in the appended claims.

Although the invention is illustrated and described herein as embodied in a circuit configuration for phase difference measurement, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
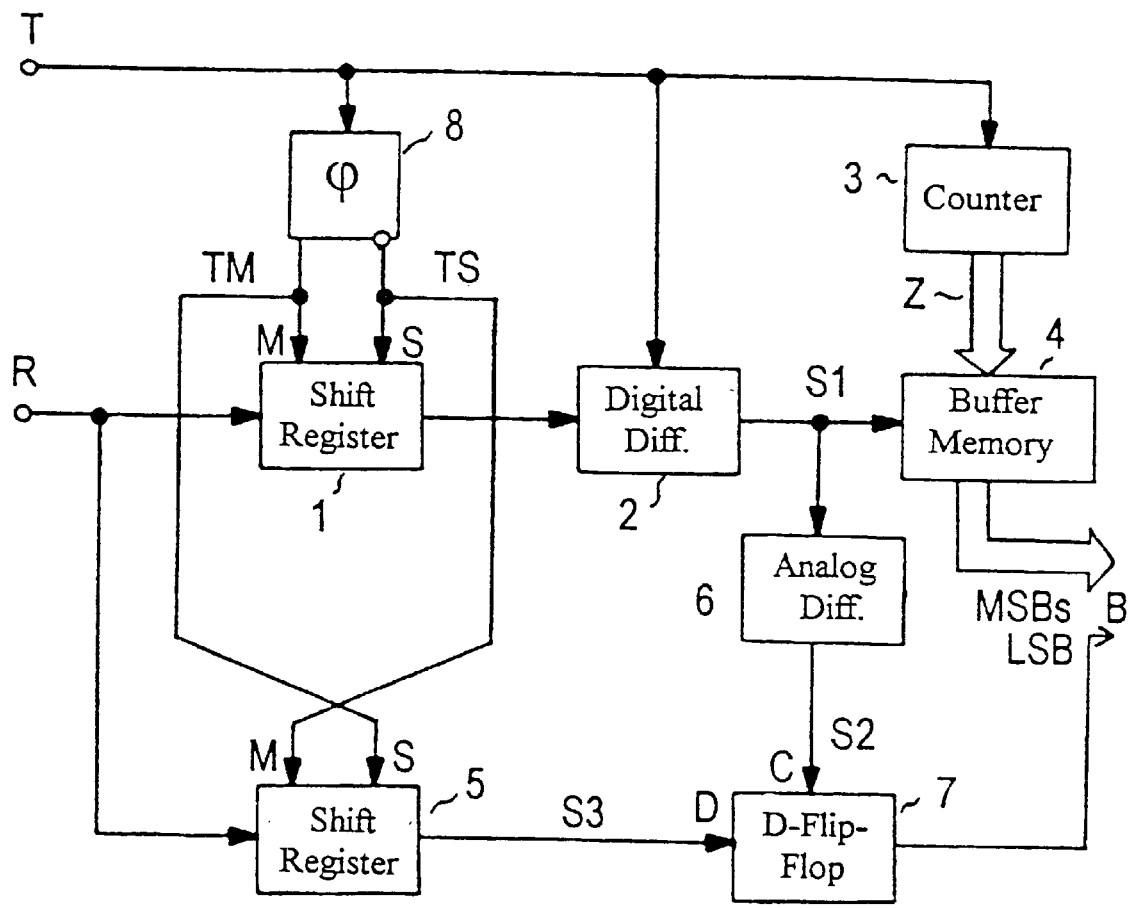
FIG. 1 is a block diagram of a circuit configuration according to the invention.

Referring now to the figures of the drawing in detail and first, particularly, to FIG. 1 thereof, there is seen an exemplary embodiment of a circuit according to the invention in which a reference signal R is applied to an input of a shift register 1. The shift register 1 is clocked by a master clock TM and a slave clock TS, which are applied to a master clock input M and slave clock input S, respectively. The master clock TM and the slave clock TS have the same frequency but are phase-offset from one another by 180° and do not overlap. The master clock TM and the slave clock TS both originate in a clock T that likewise has the same frequency and is split, through the use of a clock preparing device 8, into the master clock TM and the slave clock TS.

The shift register 1 is followed by a digital differentiator 2 which is formed, by way of example, of a delay element. An input signal and an output signal of the delay element are linked together through an AND gate. Moreover, the digital differentiator 2 is preferably clocked by the clock T so that, for example, the AND gate for linking the input and output signals of the delay element has a third input, to which the clock T is applied. A signal S1 is provided at an output of the digital differentiator 2.

A counter 3 which is triggered by the clock signal T counts continuously from 0 up to its maximum counter state and then begins again at 0. All of the binary words from 0 up to the maximum value are passed through in the process.

An output of the counter 3 is carried to an input of a buffer or intermediate memory 4, which upon the appearance of the corresponding signal S1 takes over a binary word Z that is currently present at the output of the counter 3 and stores it until such time as a new takeover occurs. The binary word that is located in the buffer memory 4 at a given time can be picked up at the output of the buffer memory 4 and forms the most significant bits MSBs of an output binary word B that indicates the phase difference between the reference signal R and the clock signal T.

A further, inversely clocked shift register 5 which is also provided has an input that also receives the reference signal R. In the case of inverse clocking, a master clock input M of the shift register 5 is triggered by the slave clock TS, and a slave clock input s of the shift register 5 is triggered by the master clock TM. A data input D of a D flip-flop 7 is connected to an output of the shift register 5 which carries a signal S3 and a signal S2 is present at a clock input C of the D f lip-flop 7. An output of the D flip-flop 7 forms the least significant bit of the output data word B.

The signal S2 is generated by an analog differentiator 6, having an input to which the signal S1 is carried. The analog differentiator 6 may, for example, be formed of a chain of series-connected gates, in which an output signal and an input signal of the chain are linked together through AND gates.

Figure 2:
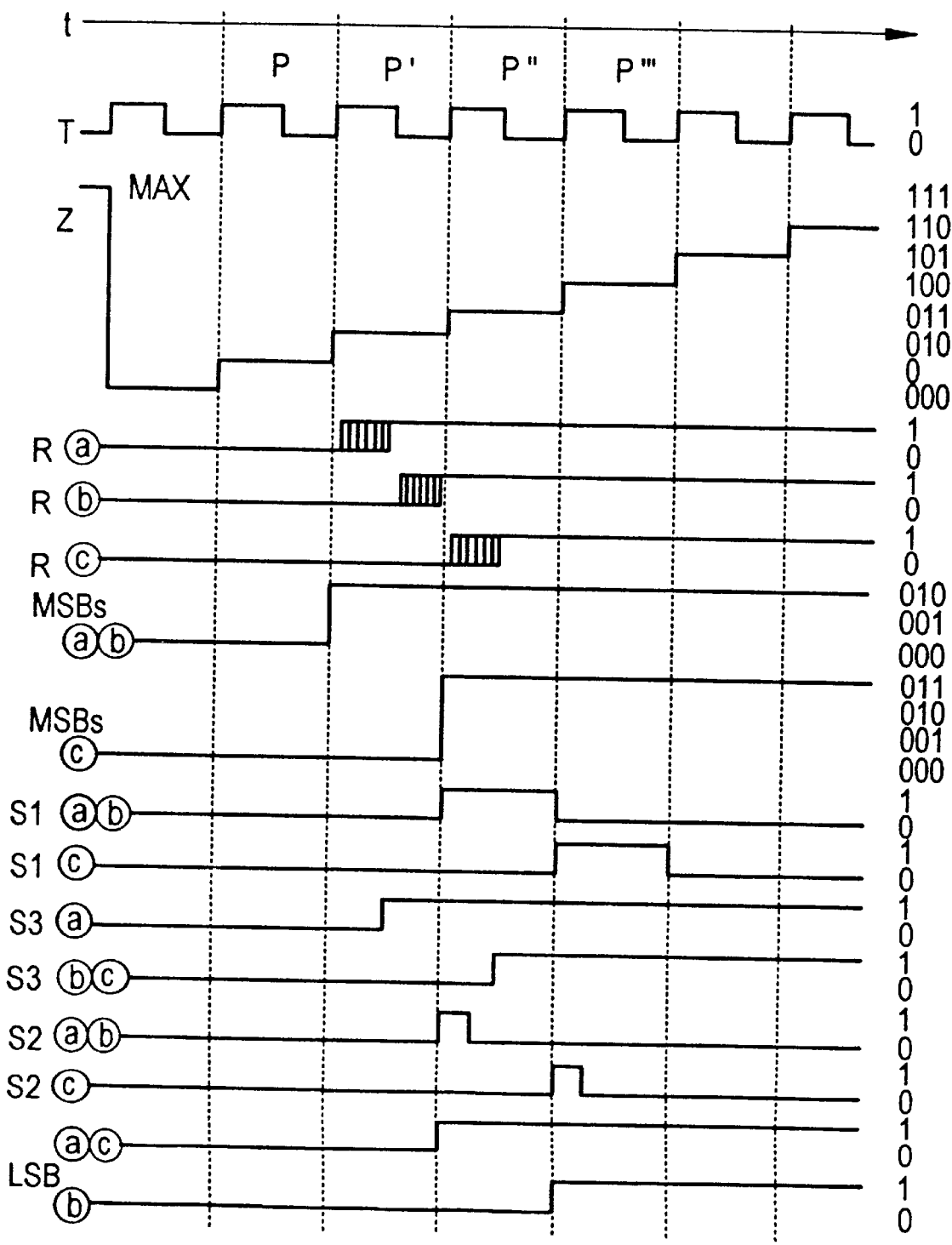
FIG. 2 is a diagram showing a signal course in a circuit configuration according to the invention.

In FIG. 2 of the drawing, courses of the signals T, Z, MSBs, S1, S2, S3 and LSB for three different phase locations of the reference signal R are plotted over time t. The three cases are designated in the drawing with letters a, b and c. A time-slot pattern is specified by a period P of the clock signal T. The master clock TM and the slave clock TS, which do not overlap at the edges, are derived from the clock signal.

In accordance with the phase locations a), b) and c) to be distinguished from one another, the edge of the reference signal R in the case a) occurs in a first half of a certain clock period P', in the case b) in a second half of this clock period P', and in the case c, in a first half of the next clock period P". Accordingly, at different moments the counter state Z, which can be plotted over the time t as a stairstep function between 0 and a maximum binary value MAX with a progression corresponding to the period P, is transferred to the buffer memory 4. This means that in the cases a) and b) the counter state Z is transferred during the first clock period P', and in the case c) it is transferred in the next clock period P". Accordingly, the most significant bits MSBs of the output binary word B are distinguished by one bit in the case c) as compared with the cases a) and b).

Consequently, in the cases a) and b), a pulse with the width P during the period P" occurs in the signal S1 at the output of the digital differentiator 2, and in the case c) it occurs in the next period P'". Conversely, due to the inverse clocking of the shift register 5, a leading edge of the signal S3 in the case a) already occurs at half the period P', and in the other two cases b) and c) it occurs at half the next period P". Since the signal S2 is derived from the positive edge of the signal S1, and since it has a shorter pulse length because of the analog differentiation by the analog differentiator 6, the transfer of the instantaneous value of the signal S3 in the cases a) and b) occurs at the beginning of the period P", and in the case c) it occurs at the beginning of the period P'". In the case a), the signal S3 is equal to one, and in the case b) it is equal to zero, until the moment of transfer at the beginning of the period P". In the case c), the signal S3 is equal to 1 at the transfer time to the beginning of the period P'". Consequently, the least significant bits LSB of the output binary word B that is ready at the output of the flip-flop 7 are equal to one in the case a), 0 in the case b), and 1 again in the case C).

However, since the chronological spacing between the cases a), b) and c) amounts to only half of the period length P, the resolution of the circuit configuration according to the invention for measuring a phase difference is twice as high as the period length P of the clock signal T, or in other words it is equal to P/2.

I claim:

1. A circuit configuration for measuring a phase difference between a reference signal and a clock signal, comprising:

a first shift register being clocked by a clock signal and having an input receiving a reference signal;

a digital differentiator being connected downstream of said first shift register and having an output;

a counter having an input receiving the clock signal and having an output outputting a multidigit binary word;

a buffer memory being connected to said counter and to said digital differentiator for storing the binary word at said output of said counter in memory upon an appearance of a corresponding output signal of said digital differentiator, said buffer memory having an output forming most significant bits of an output binary word;

a second shift register being inversely clocked by the clock signal, having an input receiving the reference signal and having an output;

an analog differentiator having an input connected to said output of said digital differentiator and having an output; and a D flip-flop having a data input connected to said output of said second shift register and a clock input connected to said output of said analog differentiator for supplying an output signal forming a least significant bit of the output binary word.

\* \* \* \* \*